US005825140A

United States Patent [19]

Fujisawa

[11] Patent Number: 5,825,140

[45] Date of Patent: Oct. 20, 1998

[54] RADIO-FREQUENCY TYPE CHARGED PARTICLE ACCELERATOR

[75] Inventor: Hiroshi Fujisawa, Kyoto, Japan

[73] Assignee: Nissin Electric Co., Ltd., Kyoto-Fu, Japan

[21] Appl. No.: 610,133

[22] Filed: Feb. 29, 1996

[51] Int. Cl.[6] .......................... H01J 37/317; H01J 23/00

[52] U.S. Cl. ...................... 315/505; 313/507; 313/362.1; 330/4.7; 250/423 R; 250/396 R; 250/492.3; 250/493.1

[58] Field of Search .................................. 315/505, 506, 315/507, 5.41, 5.42; 313/360.1, 362.1, 359.1; 330/4.6, 4.7; 250/423 R, 426, 423 F, 396 R, 492.3, 493.1

[56] References Cited

U.S. PATENT DOCUMENTS

| | | | |
|---|---|---|---|
| 4,383,180 | 5/1983 | Turner | 313/506 X |
| 4,667,111 | 5/1987 | Glavish et al. | 315/506 X |
| 4,801,847 | 1/1989 | Sakudo et al. | 315/5.41 |
| 5,483,130 | 1/1996 | Andreev | 313/505 |
| 5,504,341 | 4/1996 | Glavish | 313/505 X |
| 5,523,659 | 6/1996 | Swenson | 313/507 X |

FOREIGN PATENT DOCUMENTS

| | | | |
|---|---|---|---|
| 410346 | 1/1992 | Japan | H01J 37/317 |

OTHER PUBLICATIONS

SNQ Projektricht zum AbschluB von Phase B (Definitionsphase) Feb. 1984 Radio Frequency Ion Accelerator by N.J. Barrett Ion Implantation: Equipment and Techniques. Proceedings of the Fourth Int'l Conference; Berchtesgaden, Fed. Rep. of Germany Sep. 13–17, 1982.

A cw 4–rod RFQ linac by Hiroshi Fujisawa, Nuclear Instruments & Methods in Physics Research, 1994.

34 MHz λ/4 Spiral Resonator by H. Fujisawa et al., Bulletin of the Institute for Chemical Research, Kyoto Univ. vol. 72, No. 1, 1994.

*Primary Examiner*—Ashok Patel

*Attorney, Agent, or Firm*—Sughrue, Mion, Zinn, Macpeak & Seas, PLLC

[57] ABSTRACT

A radio-frequency type charged particle accelerator includes a RFQ accelerator and a rear stage RF accelerator both of which are contained in a single evacuated chamber. The RFQ accelerator has quadrupole electrodes positioned along a traveling path of the charged particle and bunches and accelerates a charged particle beam by receiving a radio-frequency power from a radio-frequency power source and resonating. The rear stage RF accelerator is disposed in a rear stage of the RFQ accelerator and accelerates or decelerates the energy of the charged particle beam accelerated by the RFQ accelerator by receiving the radio-frequency power from the radio-frequency power source and resonating. A separating plate is disposed in the single evacuated chamber to separate the RFQ accelerator from the rear stage RF accelerator so that the RFQ accelerator and the rear stage RF accelerator work independently of each other.

7 Claims, 5 Drawing Sheets

RADIO-FREQUENCY TYPE CHARGED PARTICLE ACCELERATOR

BACKGROUND OF THE INVENTION

1. Field of the Invention

The present invention relates to a radio-frequency type charged particle accelerator, and in particular, to a radio-frequency type charged particle accelerator which can be used in devices such as an ion implanter and a workpiece surface modification device for impinging a charged particle such as high energy ions on a workpiece.

2. Description of the Related Art

There is known an ion implanter which ionizes impurities, which is to be diffused, selectively extracts the ionized impurities by using a mass analyzing method employing a magnetic field, accelerates the ions by an electric field, and finally implants the ionized impurities into a workpiece. Such kind of ion implanter is currently becoming important in manufacturing integrated circuits (ICs), since the ion implanter can implant the ionized impurities with a good controllability regarding the amount and depth of the impurities both of which factors determine characteristics of semiconductor devices in semiconductor manufacturing processes.

Recently, semiconductor manufacturers have been demanding an ion implanter which can accelerate ions to a MeV (mega electron volt) level of high energy. This is because it has been known that the high energy ion implantation is effective for retrograde well formation, post programming in a ROM device and the like in C-MOS device manufacturing processes.

FIG. 1 shows a conventional high energy ion implanter which accelerates ions by using an RFQ (radio-frequency quadrupole) accelerator 56. The conventional high energy ion implanter comprises an ion beam generating section 51 which consists of an ion source 52 for ionizing ion source material and extracting such material as an ion beam, an analyzing magnet 53 for exclusively extracting a predetermined kind of ions by using a mass analyzing method, a lens 54 for sharply shaping the ion beam, and a high voltage power source 55 for supplying power to the ion source 52. The conventional high energy ion implanter further comprises the above-mentioned RFQ accelerator 56, disposed in a rear stage side of the ion beam generating section 51, which accelerates the ion beam leaving the beam generating section 51 to a predetermined energy level.

The RFQ accelerator 56 is provided with quadrupole electrodes 56*b* installed in an evacuated chamber 56*a* and having a modulation (or a wavy structure). The entrance portion of the RFQ accelerator 56 has a beam bunching portion for bunching the ion beam so as to efficiently accelerate the ion beam in the subsequent section or the accelerating portion of the RFQ accelerator 56. A radio-frequency power with a predetermined frequency is supplied from a radio-frequency power source (not shown) to resonate the RFQ accelerator 56, and thus a quadrupole electric field is established in a right angle direction to an ion traveling path direction. At the same time, longitudinal acceleration electric fields are established with the wavy structure of the RFQ electrodes. As a result, the ion beam bunched at the beam incident portion is simultaneously accelerated and focused by the RFQ accelerator 56.

The resonance frequency of the RFQ accelerator 56 is fixed at a predetermined value based on the structure thereof. Therefore, the RFQ accelerator 56 can not change the energy of ion species of the same kinds. Further, the acceleration efficiency of the RFQ accelerator 56 is decreased in a region which is greater than a predetermined energy level. In order to resolve these problems, a rear stage RF (radio-frequency) accelerator 57 is further disposed in a rear stage side of the RFQ accelerator 56. Namely, a desired energy can be obtained by the rear stage RF accelerator 57 further accelerating or decelerating the beam with the predetermined energy coming from the RFQ accelerator 56. A two-gap $\lambda/4$ resonator with a drift tube or cylindrical electrode 57*b* in an evacuated chamber 57*a* can be employed as the above-mentioned rear stage RF accelerator 57.

In the conventional accelerator having the RFQ accelerator 56 and the rear stage RF accelerator 57, the evacuated chamber 56*a* of the RFQ accelerator 56 is connected with the evacuated chamber 57*a* of the rear stage RF accelerator 57 through bellows 58 and a gate valve 59.

A gap length between the beam outlet of the RFQ accelerator 56 and the exit port of the RF accelerator 57 becomes relatively long, since the bellows 58, the gate valve 59, flanges and the like are disposed between these accelerators 56 and,57. Thus, a relatively long drift space is formed between the RFQ accelerator 56 and the rear stage RF accelerator 57. As a result, the beam matching between the RFQ accelerator 56 and the RF accelerator 57 becomes improper and therefore a beam transmission efficiency is decreased.

That is, the beam coming from the RFQ accelerator 56 has a bunch structure where the ions exist within a predetermined range such as between—30 degrees $<\phi<30$ degrees where $\phi$ denotes a phase. However, since the ions with an advanced phase travel at a relatively high speed and the ions with a retarded phase travel at a relatively low speed, the bunched beam becomes elongated in time as the beam travels in the drift space between the accelerators 56 and 57 and the phase spread of the beam expands outside of the predetermined range. The rear stage RF accelerator 57 accelerates only the ions within the predetermined range of the phase. As a result, the longer the drift space is and the wider the bunched beam expands, the less the ions can be accelerated by the RF accelerator 57. Thus, the transmission efficiency of the beam is decreased in the accelerator 57.

Further, the total length of the radio-frequency type charged particle accelerator becomes long because of the necessity of installing the bellows 58 and the gate valve 59, and therefore the size of the accelerator becomes large, the number of the components of the accelerator is increased and the cost of the accelerator becomes high.

Moreover, since the RFQ accelerator 56 and the RF accelerator 57 are respectively and separately disposed in the evacuated chambers 56*a* and 57*a*, it is difficult to match the beam axis of the RF accelerator 57 with the beam axis of the RF accelerator 56. More specifically, the RFQ accelerator 56 and the RF accelerator 57 are at first independently accurately positioned in the respective evacuated chambers 56*a* and 57*a* and then fixed to the chambers 56*a* and 57*a*, and thereafter both of the evacuated chambers 56*a* and 57*a* are respectively accurately positioned and fixed to a base. Further, after both of the evacuated chambers 56*a* and 57*a* have been fixed to the base, both of the beam axis of the RFQ accelerator 56 and that of the RF accelerator 57 are shifted when one of the fixed positions of these two evacuated chambers 56*a* and 57*a* of the accelerators 56 and 57 is shifted by an earthquake or the like.

SUMMARY OF THE INVENTION

It is therefore an object of the present invention to provide a radio-frequency type charged particle accelerator which can increase a beam transmission efficiency.

It is another object of the present invention to provide a radio-frequency type charged particle accelerator which has a compact size and is low in cost.

It is still another object of the present invention to provide a radio-frequency type charged particle accelerator wherein an operation for matching two beam axes of two accelerators becomes easy and therefore no shifting of the beam axes of the accelerators is likely to occur.

These and other objects are achieved according to the present invention by providing a radio-frequency type charged particle accelerator comprising RFQ accelerating means, including quadrupole electrodes positioned along a traveling path of the charged particle, for bunching and accelerating a charged particle beam by receiving a radio-frequency power from a radio-frequency power source and resonating, rear stage RF means disposed in a rear stage of the RFQ accelerating means for changing the energy of the charged particle beam accelerated by the RFQ accelerating means by receiving the radio-frequency power from the radio-frequency power source and resonating, a single evacuated chamber for containing both of said RFQ accelerating means and said rear stage RF accelerating means, and separating means disposed in said single evacuated chamber for separating said RFQ accelerating means and said rear stage RF means so that the RFQ accelerating means and the Sear stage RF means work independently of each other.

In a preferred embodiment of the present invention, a resonance frequency of the RFQ accelerating mean is a predetermined fixed frequency.

In another embodiment of the present invention, the rear stage RF means further accelerates or decelerates the energy of the charged particle accelerated by the RFQ accelerating means.

In a still another embodiment of the present invention, the separating means is made substantially out of copper.

The above and other objects and features of the present invention will be apparent from the following description made with reference to the accompanying drawings relating to preferred embodiments of the present invention.

DETAILED DESCRIPTION OF THE PREFERRED EMBODIMENT

The present invention will now be explained with reference to a preferred embodiment and the drawings.

Figure 1:
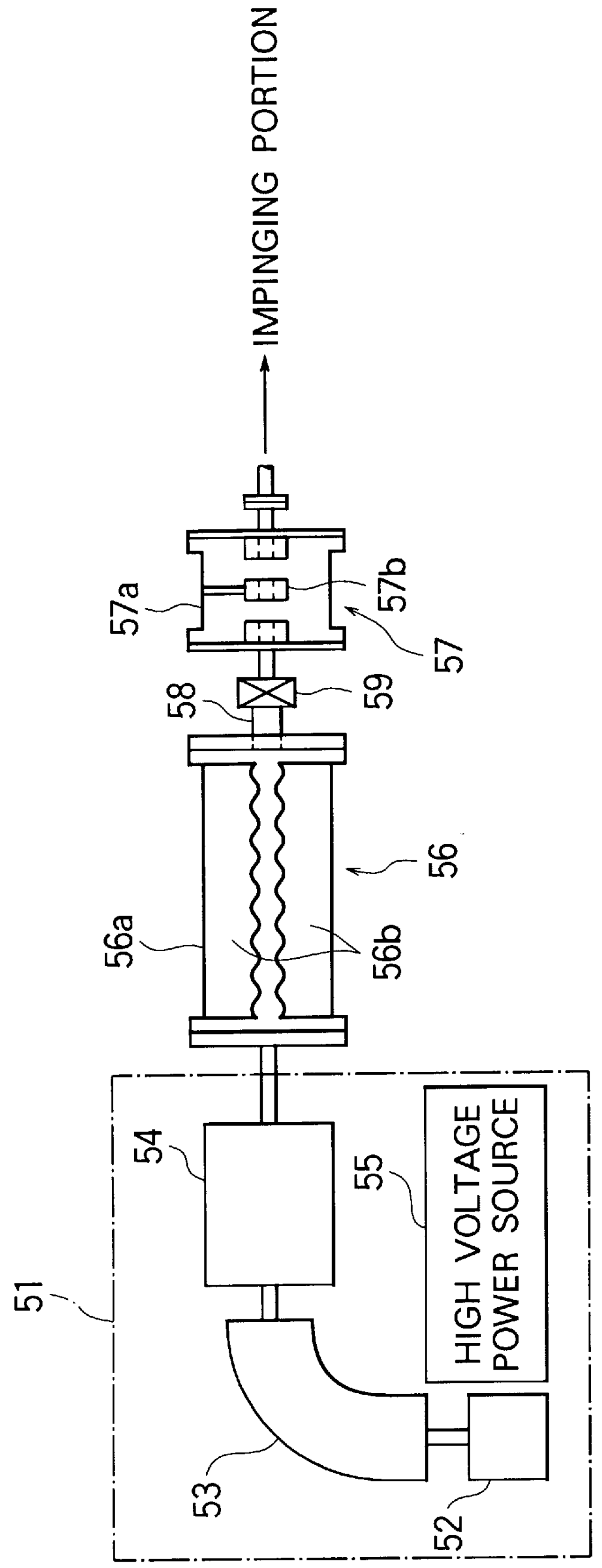
FIG. 1 (PRIOR ART)
FIG. 1 is a schematic view showing a conventional high energy ion implanter.
Figure 2:
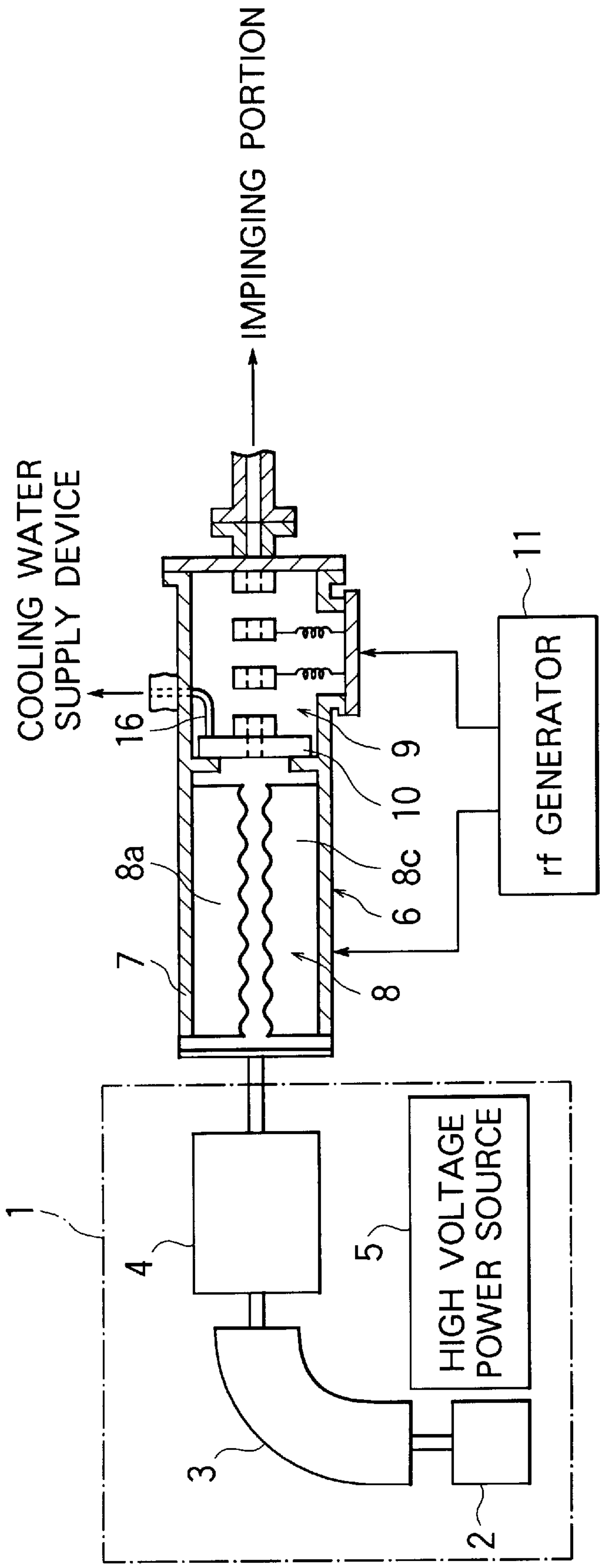
FIG. 2 is a schematic view showing a high energy ion implanter with a radio-frequency type ion accelerator which is an embodiment of the present invention.

An embodiment of the present invention will be explained with reference to FIG. 2. As shown in FIG. 2, a radio-frequency type ion accelerating device 6 (hereinafter called RF accelerating device) will be explained, such a device being an embodiment of a radio-frequency type charged particle accelerator of the present invention. The RF accelerating device 6 is used in a high energy ion implanter, and is connected with the rear stage side of an ion beam generating section 1.

The ion beam generating section 1 includes an ion source 2 for ionizing an ion source material and extracting an ion beam, an analyzing magnet 3 for exclusively extracting a predetermined kind of ions by using a mass analyzing method, a lens system 4 for sharply shaping the ion beam, and a high voltage power source 5 for supplying the power to the ion source 2.

The RF accelerating device 6 is provided with a single evacuated chamber 7 in which both an RFQ (radio-frequency quadrupole) accelerator 8 and a rear stage RF (radio-frequency) accelerator 9 are integrally disposed. A separation plate 10 is installed between the accelerators 8 and 9 in the evacuated chamber 7 so that the RFQ accelerator 8 and RF accelerator 9 can work independently of each other in the single evacuated chamber 7. The device 6 is further provided with a radio frequency power source or rf generator 11, a radio frequency power being supplied from the power source 11 to the RFQ accelerator 8 and the RF accelerator 9.

The evacuated chamber 7 is provided with an opening (not shown) connected to a high vacuum pump (not shown) and two ports (not shown) through which the high radio-frequency power is respectively supplied to the RFQ accelerator 8 and the rear stage RF accelerator 9.

Figure 3:
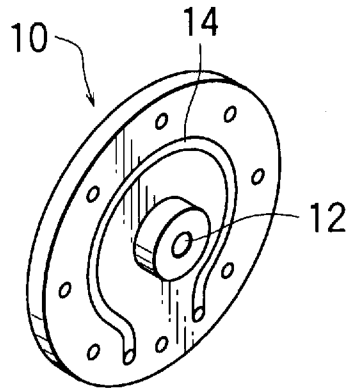
FIG. 3 is a perspective view showing a separation plate.

As shown in FIG. 3, the separation plate 10 is made out of material such as copper which has a low resistance against a radio-frequency current. The separation plate 10 may also be made out of an iron plate and the like whose surfaces are plated with copper. The separation plate 10 is provided with a beam aperture 12 in a center axis thereof. The separation plate 10 is equipped with a cooling pipe 14 which is connected through a connection pipe 16 (see FIG. 2) with a cooling water supply device disposed outside of the evacuated chamber 7. The cooling pipe 14 is filled with coolant such as water so as to prevent overheating during an operation of the device.

The RFQ accelerator 8 will be explained with reference to FIGS. 2, 4 and 5. The RFQ accelerator 8 is a new type of radio-frequency linear ion accelerator in which an ion beam is simultaneously accelerated and focused in a time varying electric field. The bunching and transmission efficiency of the RFQ accelerator 8 surpasses any other type of linear ion accelerator existing today, and 80% or more of an injected beam is accelerated without degradation of the beam quality. The biggest advantage of the RFQ accelerator 8 is that it accelerates high current (1 mA to 100 mA) light and medium ions to mega electron volt (MeV) energies by injecting a low energy (30 to 100 keV) direct current (DC) ion beam.

Figure 4:
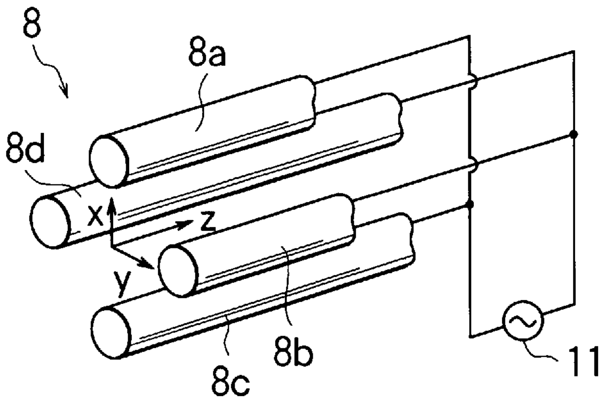
FIG. 4 is a schematic perspective view showing quadrupole electrodes used in an RFQ accelerator.
Figure 5:
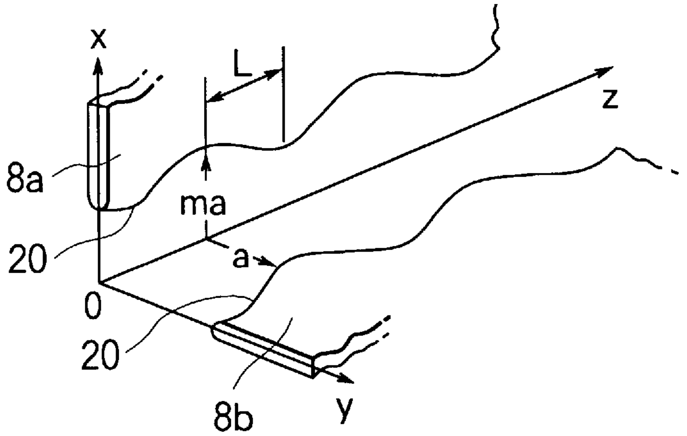
FIG. 5 is a perspective portion view showing quadrupole electrodes.

As specifically shown in FIGS. 4 and 5, the RFQ accelerator 8 comprises quadrupole electrodes **8*a*, 8*b*, 8*c* and 8*d* extending along a beam traveling axis or a z-axis direction. The quadrupole electrodes 8*a*, 8*b*, 8*c* and 8*d* are oriented around the beam axis and separated at equi-angle from each other to form time varying transverse electric quadrupole fields. The quadrupole electrodes 8*a*, 8*b*, 8*c* and 8*d* have modulations (or wavy structures), on surfaces thereof facing each other, which are 180 degrees out of phase in an adjacent electrode, thus making the time varying longitudinal accelerating field in the direction of ion acceleration. The degree of acceleration depends on the amplitude (or ma and a in FIG. 5) of the modulation. The ions in the RFQ accelerator 8 travel a section defined by a peak and a valley of the electrode modulation (what we call one "half cell") in ½ rf period. As the ions enter the next half cell, the electrode polarity switches the sign, therefore ions are further accelerated in that cell. This sequence of acceleration continues throughout the RFQ accelerator 8 to the end of the electrodes 8***a*, 8*b*, 8*c* and 8*d*.

The entrance section of the RFQ accelerator 8 works as a beam bunching portion. Therefore, the electrode modulations in the beam bunching portion are relatively small and the length of the half cells are relatively short. The rest of the RFQ accelerator 8 works as a beam accelerating portion for accelerating the bunched ion beam. Therefore, the electrode modulations in the beam accelerating portion are larger than those in the beam bunching portion and the length of half cells in the beam accelerating portion are longer than those in the beam bunching portion.

A ion beam with an initial energy enters the RFQ accelerator 8. The ion beam is given a small longitudinal rf electric field in steps such that the ion beam is adiabatically bunched in the beam bunching portion of the RFQ accelerator 8. In other words, the phase spread of the ion beam is narrowed from ±180 degrees (DC beam) to approximately ±45 degrees in the beam bunching portion. The accelerating portion of the RFQ accelerator 8 accelerates in steps the bunched beam to a target energy to maintain the bunch structure. Since the geometrical length (L) of cells in the RFQ accelerator 8 is proportional to the product of ion velocity (v) and rf wave length (λ), the ion velocity in each cell is the same whatever type of ions is accelerated in the fixed-frequency RFQ accelerator 8. In terms of energy, an ion energy per nucleon in each cell is the same whatever type of ions is accelerated in the fixed-frequency RFQ accelerator 8. Therefore, the output energy of ions is proportional to their mass and is fixed. The power requirement needed to accelerate an ion beam is inversely proportional to the square of the ion charge: doubly charged ions of a particular mass can be accelerated to the target energy with a quarter of the rf power needed to do the same for singly-charged ions of the same mass.

Figure 6:
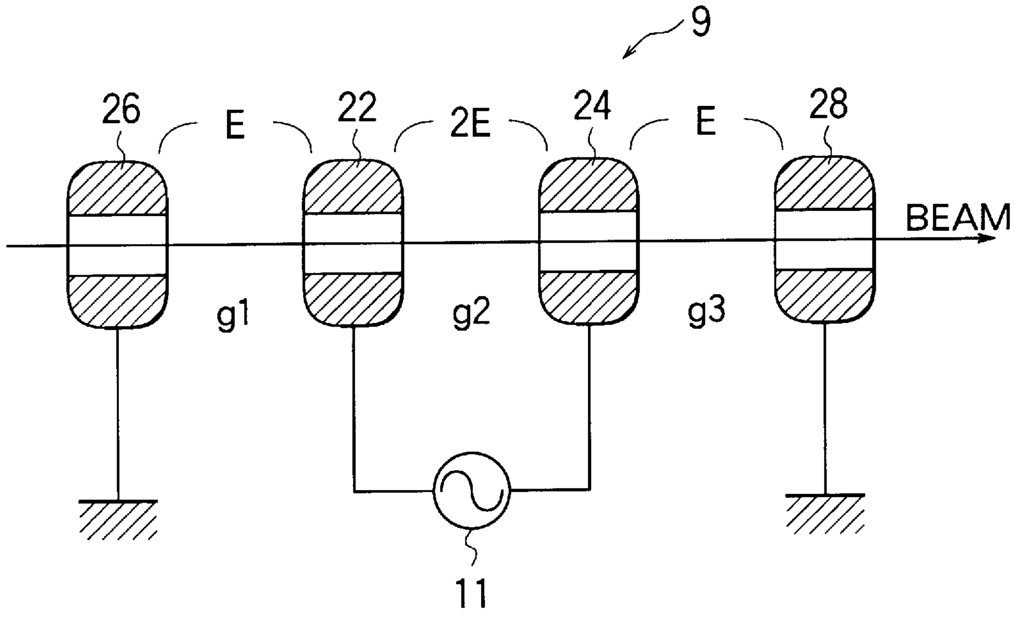
FIG. 6 is a schematic front view showing two accelerating electrodes and two earth electrodes used in an RF accelerator.

Referring to FIG. 6, the rear stage RF accelerator 9 added to the RFQ accelerator 8 further accelerates or decelerates the ion beam coming out of the RFQ accelerator 8. The rear stage RF accelerator 9 includes a pair of accelerating electrodes 22 and 24 and two earth electrodes 26 and 28 disposed on the both sides of the accelerating electrodes 22 and 24. The earth electrodes 26 and 28 are kept at ground potential. A first accelerating gap g1 is formed between the electrodes 26 and 22, a second accelerating gap g2 is formed between the electrodes 22 and 24, and a third accelerating gap g3 is formed between the electrodes 24 and 28.

Since a beam from the RFQ accelerator 8 is bunched, acceleration or deceleration of the beam by the RF accelerator 9 can be done by choosing correct phasing of the rf electric field in the accelerating gaps g1, g2 and g3. To be an accelerator suitable for the acceleration of low velocity ions as may be used in an ion implantation machine, the RF accelerator 9 preferably has twin-gaps or triple gaps (or more gaps) operated in a frequency between 10 to 100 MHz. A single gap structure is most desirable in terms of ion energy variability but the structure becomes too large in such a low rf frequency.

Figure 7:
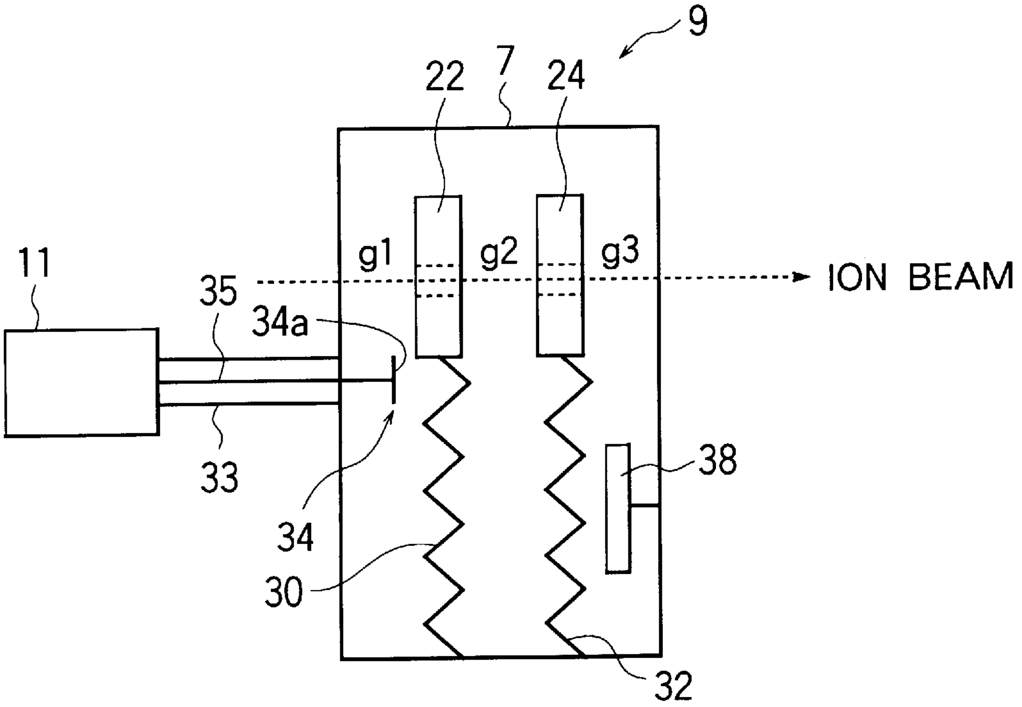
FIG. 7 is a schematic view showing the two accelerating electrodes with a resonance circuit.

Referring to FIG. 7, the RF accelerator 9 is of a triple-gap λ/4 resonator type linear accelerating and decelerating structure. The resonator of the RF accelerator 9 includes two drift tubes or cylindrical electrodes 22 and 24, two coils 30 and 32 working as inductors, a capacitive coupler 34 for supplying a rf power source from the rf generator 11 to the resonator 9, a frequency tuner 38 for adjusting a resonant frequency, and the single evacuated chamber 7. One ends of the coils 30 and 32 are connected with the electrodes 22 and 24 while their other ends are connected with the evacuated chamber 7 where the voltage is kept at the ground potential. The earth electrodes 26 and 28 are not shown in FIG. 7. The capacitive coupler 34 is disposed to effectively supply the rf power, which is propagated in a coaxial tube 33 (or a coaxial cable), into the evacuated chamber 7. A conductor 35 in the coaxial tube 33 extends into the evacuated chamber 7, and a plate 34*a* of the capacitive coupler 34 is connected with the front end of the conductor 35 and positioned above the coil 30. Thus, a capacitance is established between the plate 34*a* of the capacitive coupler 34 and a portion having a high electric field in the accelerator 9. The capacitance is determined by the area of the plate 34*a*, the distance between the plate 34*a* and the coil 30 and the like. The resonance frequency tuner 38 is disposed to adjust or correct from the outside of the evacuated chamber 7 a change in the resonance frequency initiated by a thermal expansion of the evacuated chamber 7 and the like which are caused when the rf power is supplied. Such adjustment of the change in the resonance frequency is necessary because of the following reasons. The RF accelerator 9 needs to be operated at the fixed frequency. However, the Q value of the RF accelerator 9 is very high. Therefore, when the frequency of the rf power supplied from the rf generator 11 is shifted from the resonance frequency in the evacuated chamber 7, the rf power is reflected. As a result, the rf power can not be introduced into the evacuated chamber 7.

In the rear stage RF accelerator 9, adjacent electrodes of the electrodes 22 and 24 oscillate 180 degrees out of phase. This means that when one of the adjacent electrodes is at an electric field +E, the other will be at an electric field −E. The gap-to-gap distances chosen are such that as the ions travel from one gap to the following gap, the electrode polarity switches the sign, and thus the ions are again accelerated to higher energies. The contributions of accelerating electric fields from g1, g2 and g3 are +E, +2E and +E, thus making a total maximum accelerating electric field to be +4E. On the other hand, the deceleration of an ion beam is just the opposite of the acceleration mode.

Figure 8:
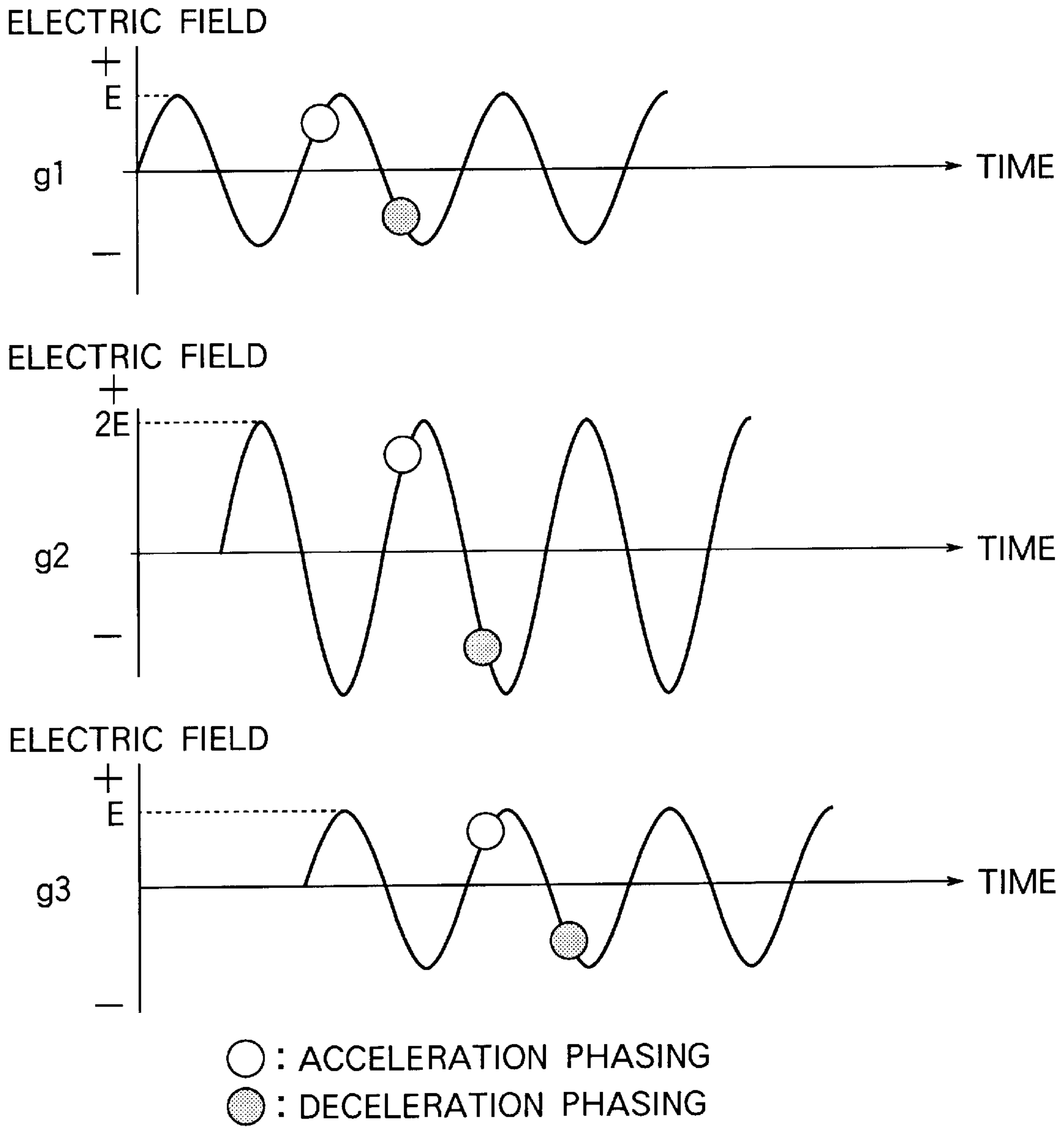
FIG. 8 are graphs showing electric fields generated in respective gaps g1, g2 and g3 of the RF accelerator.

FIG. 8 shows accelerating electric fields established in the gaps g1, g2 and g3. The accelerating electric fields of the gaps g1 and g3 alternate with the same phase and amplitude. On the contrary, The accelerating electric field of the gap g2 has the phase 180 degrees out of the phases of the gaps g1 and g3 and an amplitude two times larger than the amplitudes of the gaps g1 and g3. In FIG. 8, for positively charged ions, white circles on the waves indicate the phase timing for acceleration and black circles indicates the phase timing for deceleration.

Next, an operation of the RF accelerating device 6 will be explained. A predetermined radio-frequency is applied from a radio-frequency power source 11 to the RFQ accelerator 8, and a quadrupole electric field is established in a right angle direction to the ion beam traveling path. The ion beam coming from the ion beam generating section 1 enters into the RFQ accelerator 8 and is then bunched in the bunch portion of the accelerator 8. That is, the ion beam is bunched so that the phase of the ion beam is within a predetermined range. Thereafter, the ion beam bunched at the beam bunching portion is simultaneously converged and accelerated by the accelerating portion of the RFQ accelerator 8.

The beam accelerated up to a predetermined energy level by the RFQ accelerator 8 travels through the aperture 12 of the separation plate 10 and then directly enters the rear stage RF accelerator 9. Since the length between the accelerators 8 and 9 is relatively very short, the phase spread of the bunched ion beam does not expand like that in the case of the conventional accelerating device explained above. Therefore, the bunched ion beam coming from the RFQ accelerator 8 enters the RF accelerator still having the same phase range as the phase range at the outlet of the RFQ accelerator 8.

The rear stage RF accelerator 9 can accelerate or decelerate the bunched ion beam in the triple gaps g1, g2 and g3 by changing 180 degrees in a phase relationship between the RFQ accelerator 8 and the rear stage RF accelerator 9. Thereafter, the ion beam accelerated by the RF accelerator 9 is impinged on the workpiece such as a semiconductor wafer.

According to the embodiment of the present invention, the length between the accelerators 8 and 9 is relatively very short, and therefore the bunched ion beam coming from the RFQ accelerator 8 enters the RF accelerator 9 still having the same phase range as the phase range at the outlet of the RFQ accelerator 8. As a result, the beam axis of the RF accelerator 9 is well matched with that of the RFQ accelerator 8 and therefore the transmission efficiency can be increased.

Further, according to the embodiment of the present invention, the bellows, the gate valve and the like disposed between the RFQ accelerator and the RF accelerator in the conventional device are unnecessary. As a result, the total length of the accelerating device becomes smaller than that of the conventional device and therefore a small size device can be obtained. Moreover, since one evacuated chamber, the bellows and the gate valve, all of which were essential components in the conventional device, are unnecessary, the number of the components of the accelerating device is decreased and therefore the cost of the accelerating device becomes low.

Still further, according to the embodiment of the present invention, the beam axis of the RF accelerator 9 is matched easier with the beam axis of the RFQ accelerator 8 than that of the conventional accelerating device. That is, in the conventional accelerating device, matching of the beam axis of the RF accelerator with that of the RFQ accelerator requires not only the accurate positioning of the accelerators in the evacuated chambers but also the accurate positioning of the evacuated chambers. On the contrary, in the RF accelerating device 6 of the embodiment of the invention, the matching of the beam axes of the RFQ accelerator 8 and the RF accelerator 9 requires only the accurate positioning of the RFQ accelerator 8 and the RF accelerator 9 in the single evacuated chamber 7. Further, in the conventional accelerating device, the beam axes of both the RFQ accelerator and the RF accelerator are shifted when one of the fixed positions of these two evacuated chambers of the RFQ and RF accelerators is moved by an earthquake or the like. On the contrary, in the RF accelerating device 6 of the embodiment of the invention, after the beam axes of both the accelerators 8 and 9 have been once matched with each other in the single evacuated chamber 7, it is difficult to shift the beam axes even when an earthquake occurs.

The above-mentioned embodiment is applied to a high energy ion implanter. The radio-frequency type charged particle accelerator of the present invention may also be applied to other devices. A spiral resonator may be employed as the rear stage accelerator.

While the present invention has been illustrated by means of a preferred embodiment, one of ordinary skill in the art will recognize that modifications and improvements can be made while remaining within the spirit and scope of the invention. The scope of the invention is determined solely by the appended claims.

What is claimed is:

1. A radio-frequency charged particle accelerator, comprising:

RFQ accelerating means, including quadrupole electrodes positioned along a traveling path of the charged particle, for bunching and accelerating a charged particle beam by receiving a radio-frequency power from a radio-frequency power source and resonating;

rear stage RF means disposed in a rear stage of the RFQ accelerating means for changing the energy of the charged particle beam accelerated by the RFQ accelerating means by receiving the radio-frequency power from the radio-frequency power source and resonating;

a single evacuated chamber for containing both said RFQ accelerating means and said rear stage RF accelerating means; and separating means disposed in said single evacuated chamber for separating said RFQ accelerating means and said rear stage RF means so that the RFQ accelerating means and the rear stage RF means work independently of each other.

2. An accelerator according to claim 1, wherein a resonance frequency of the RFQ accelerating mean is a predetermined fixed frequency.

3. An accelerator according to claim 2, wherein said rear stage RF means further accelerates or decelerates the energy of the charged particle accelerated by the RFQ accelerating means.

4. An accelerator according to claim 3, wherein a resonance frequency of the rear stage RF mean is the predetermined fixed frequency.

5. An accelerator according to claim 1, wherein said rear stage RF means includes at least a pair of cylindrical accelerating electrodes and earth electrodes disposed at both sides of the accelerating electrodes.

6. An accelerator according to claim 1, wherein said separating means is made substantially out of copper.

7. An accelerator according to claim 1, wherein said separating means includes a cooling device.

* * * * *